(12) United States Patent
Sonoda

(10) Patent No.: US 6,662,143 B2
(45) Date of Patent: Dec. 9, 2003

(54) MEASURING METHOD AND MEASURING DEVICE

(75) Inventor: Kenichiro Sonoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 264 days.

(21) Appl. No.: 09/907,702

(22) Filed: Jul. 19, 2001

(65) Prior Publication Data

US 2002/0147571 A1 Oct. 10, 2002

(30) Foreign Application Priority Data

Feb. 22, 2001 (JP) ........................................ 2001-046416

(51) Int. Cl.$^7$ .............................................. G06F 19/00
(52) U.S. Cl. ........................................ 702/194; 702/179
(58) Field of Search ................................ 702/194, 189, 702/190, 191, 193, 199, 179

(56) References Cited

U.S. PATENT DOCUMENTS

| | | | |
|---|---|---|---|
| 5,673,197 A | * 9/1997 | Keba et al. | 702/179 |
| 6,484,132 B1 | * 11/2002 | Hively et al. | 702/190 |
| 6,515,500 B1 | * 2/2003 | Okuda | 324/765 |
| 2002/0060584 A1 | * 5/2002 | Okuda | 324/765 |
| 2002/0143495 A1 | * 10/2002 | Roser | 702/179 |

FOREIGN PATENT DOCUMENTS

| | | |
|---|---|---|
| JP | 60-225076 | 11/1985 |
| JP | 1-156682 | 6/1989 |
| KR | 1988-7000372 | 3/1988 |

* cited by examiner

Primary Examiner—Patrick Assouad
(74) Attorney, Agent, or Firm—Oblon, Spivak, McClelland, Maier & Neustadt, P.C.

(57) ABSTRACT

An object of the present invention is to provide a measuring device and a measuring method capable of determining the number of averaging (the number of measurements automatically made in the measuring device) in the measuring device performing averaging process (automatically making plural measurements on a certain characteristic amount of a sample, and performing a process such as weight assignment, thereby obtaining an average value of measured results obtained from the plural measurements and outputting the average value as the measured result of the sample) while maintaining compatibleness of required measuring accuracy and efficiency in measurements. $1/\epsilon_1^2 \cdot (\sigma_i/\sigma_s)^2 \cdot N_0$ is calculated using a standard deviation $\sigma_i$ obtained from plural measurements made on one of a plurality of samples, a standard deviation $\sigma_s$ obtained from measurements made on the plurality of samples, an initial value $N_0$ of the number of averaging and a desired ratio of uncertainties $\epsilon_1$, and an integer not lower than the calculated result is employed as the number of averaging N. Then, the averaging process is again performed on each of the plurality of samples by the number of averaging N while performing measurements, thereby calculating the standard deviation $\sigma_s$.

12 Claims, 7 Drawing Sheets

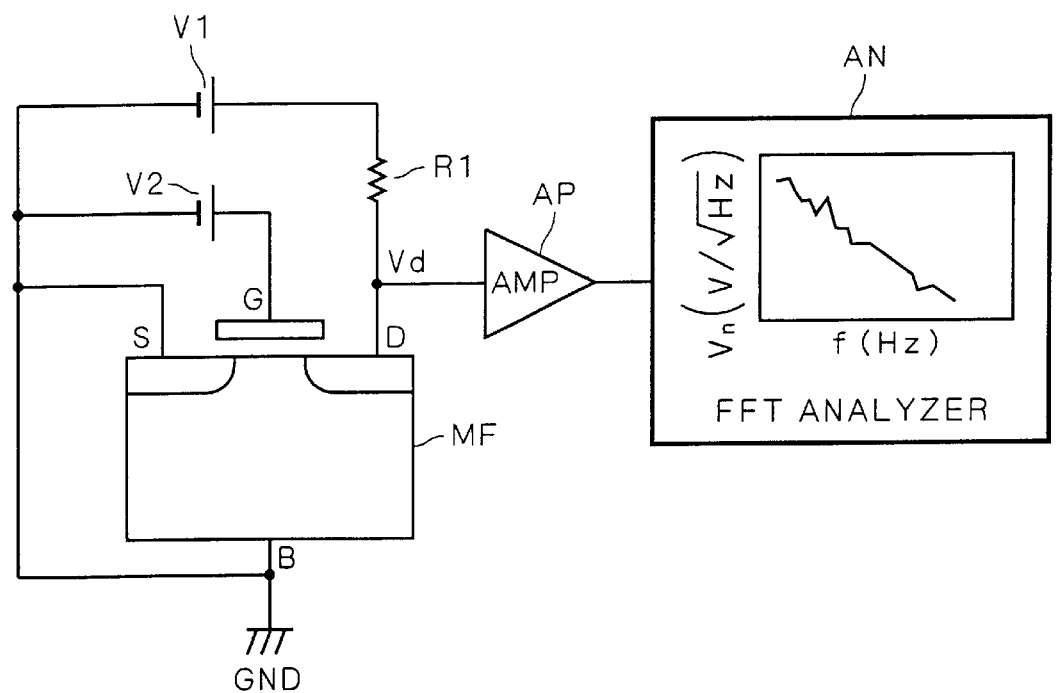
F I G . 2

MEASURING METHOD AND MEASURING DEVICE

BACKGROUND OF THE INVENTION

1. Field of the Invention

The present invention relates to a measuring device and a measuring method for measuring variations in electric characteristics of a semiconductor device.

2. Description of the Background Art

Along with size reduction of a semiconductor device, relative variations in electric characteristics among elements are becoming greater. Such variations in characteristics cause a malfunction of a circuit and a reduction in yields of products. Therefore, there is a growing need for achieving circuit design taking such variations into account upon correct estimation of the variations.

As statistical analysis means for estimating variations quantitatively, there is a method of measuring a plurality of samples under the same condition and calculating a standard deviation of measured results. In this case, a measurement on a certain electric characteristic of the plurality of samples results in a measured value that generally includes uncertainties due to an external noise and the like in addition to a characteristic amount desired to be measured.

In many cases, such uncertainties distribute at random without concentrating in a certain sample. In other words, variations resulting from such uncertainties and variations in electric characteristics themselves of a sample are independent of each other. Accordingly, assuming that a standard deviation of a measured value is $\sigma$, a standard deviation resulting from variations in electric characteristics of a sample themselves is $\sigma_0$, and a standard deviation resulting from uncertainties such as an external noise is $\sigma_1$, the following relation $$\sigma^2 = \sigma_0^2 + \sigma_1^2 \tag{1}$$

holds.

As seen from the expression (1), in order that the standard deviation $\sigma_0$ resulting from variations in electric characteristics of a sample themselves should be reflected on the standard deviation $\sigma$ of a measured value, it is necessary to minimize a value of the standard deviation $\sigma_1$ resulting from uncertainties such as an external noise to a negligible extent compared to a value of the standard deviation $\sigma_0$.

There is a measuring device in which, in order to minimize the value of the standard deviation $\sigma_1$, plural measurements are automatically made on the same characteristic amount of a sample, and a processing such as weight assignment (e.g., assigning light weights on data measured at the outset of the measurements since an apparatus may have not yet been adjusted completely, and assigning heavier weights on data measured later) is further carried out, thereby obtaining an average value of measured results obtained by the plural measurements and outputting the average value as the measured result of the sample (hereinafter referred to as averaging process). The number of measurements automatically performed in the measuring device (hereinafter referred to as the number of averaging) is a parameter that can be set freely by an observer.

Generally, an influence of uncertainties exerted on a measured result decreases with an increase in the number of averaging, however, the time required for measurements increases with the increase in the number of averaging. Therefore, it is necessary to set a value of the number of averaging performed in the above measuring device to an optimum value in order to maintain compatibleness of required measuring accuracy and efficiency in measurements.

However, there has not been established a method of determining the number of averaging, but the number has been determined empirically.

SUMMARY OF THE INVENTION

A first aspect of the present invention is directed to a measuring method of making measurements on a predetermined characteristic amount of a plurality of samples and obtaining a standard deviation of the predetermined characteristic amount of the plurality of samples, wherein averaging process of making measurements by the predetermined number $N_0$ and obtaining an average value of measured results is performed in each one of the measurements. The measuring method comprises the steps of: (a) making plural measurements on the predetermined characteristic amount of one of the plurality of samples under the same condition, thereby calculating a standard deviation $\sigma_i$ of the one of the plurality of samples from measured results of the measurements; (b) making a measurement on the predetermined characteristic amount of each of the plurality of samples under the same condition, thereby calculating a standard deviation $\sigma_s$ of the plurality of samples from the measured results of the measurements; (c) obtaining the number of averaging N using the standard deviations $\sigma_i$ and $\sigma_s$ and the predetermined number $N_0$; and (d) performing again the averaging process by the number of averaging N while measuring the predetermined characteristic amount, and calculating the standard deviation $\sigma_s$ of the plurality of samples from measured results of the measurements made on the plurality of samples.

According to a second aspect of the present invention, in the measuring method of the first aspect, in the step (c), $1/\epsilon_1^2 \cdot (\sigma_i/\sigma_s)^2 \cdot N_0$ is calculated using the ratio of uncertainties $\epsilon_1$ which is a requested value as a ratio between the standard deviations $\sigma_i$ and $\sigma_s$, and an integer not lower than a calculated result is employed as the number of averaging N.

According to a third aspect of the present invention, in the measuring method of the second aspect, in the step (c), a value employed as the number of averaging N is obtained by adding a predetermined allowance to the lowest integer not lower than the calculated result of $1/\epsilon_1^2 \cdot (\sigma_i/\sigma_s)^2 \cdot N_0$.

According to a fourth aspect of the present invention, the measuring method of the second aspect further comprises the step of (e) judging before the step (c) whether the standard deviation $\sigma_s$ calculated in the step (b) satisfies a relation $\sigma_i \leq \epsilon_1 \cdot \sigma_s$ using the standard deviation $\sigma_i$ and the ratio of uncertainties $\epsilon_1$ calculated in the step (a), wherein the steps (c) and (d) are performed only when the relation does not hold in the step (e).

A fifth aspect of the present invention is directed to a measuring device comprising: measuring means for measuring a predetermined characteristic amount of a plurality of samples; first calculating means for calculating a standard deviation of the predetermined characteristic amount; second calculating means for calculating the number of averaging N; and controlling means for controlling the measuring means and first and second calculating means, and causing the measuring means to make measurements by the predetermined number $N_0$ in each of the measurements, thereby performing averaging process of obtaining an average value of measured results. In the measuring device, the measuring means makes plural measurements on the predetermined characteristic amount of one of the plurality of samples under the same condition, the controlling means provides the first calculating means with the measured results of the plural measurements made by the measuring means, thereby causing the first calculating means to calculate a standard deviation $\sigma_i$ of the one of the plurality of samples, the measuring means further makes a measurement on the predetermined characteristic amount of each one of the plurality of samples under the same condition, the controlling means provides the first calculating means with each of measured results of the measurements made on the plurality of samples by the measuring means, thereby causing the first calculating means to calculate a standard deviation $\sigma_s$ of the plurality of samples, the controlling means provides the second calculating means with the standard deviations $\sigma_i$ and $\sigma_s$ obtained by the first calculating means and the predetermined number $N_0$, thereby causing the second calculating means to calculate the number of averaging N, the controlling means again performs averaging process on each of the plurality of samples by the number of averaging N, while causing the measuring means to measure the predetermined characteristic amount, and providing the first calculating means with each of measured results of the plurality of samples made by the measuring means, thereby causing the first calculating means to calculate a standard deviation $\sigma_s$ of the plurality of samples based on measurement results of the plurality of samples so as to be outputted.

According to a sixth aspect of the present invention, in the measuring device of the fifth aspect, the second calculating means calculates $1/\epsilon_1^2 \cdot (\sigma_i/\sigma_s)^2 \cdot N_0$ using a ratio of uncertainties $\epsilon_1$ previously inputted which is a requested value as a ratio between the standard deviations $\sigma_i$ and $\sigma_s$, and employs an integer not lower than a calculated result as the number of averaging N.

According to a seventh aspect of the present invention, in the measuring device of the sixth aspect, the second calculating means employs, as the number of averaging N, a value obtained by adding a predetermined allowance to the lowest integer not lower than the calculated result of $1/\epsilon_1^2 \cdot (\sigma_i/\sigma_s)^2 \cdot N_0$.

According to an eighth aspect of the present invention, in the measuring device of the sixth aspect, the controlling means judges whether the standard deviation $\sigma_s$ calculated by the first calculating means satisfies a relation $\sigma_i \leq \epsilon_1 \cdot \sigma_s$ in which the standard deviation $\sigma_i$ and the ratio of uncertainties $\epsilon_1$ are used before causing the second calculating means to calculate $1/\epsilon_1^2 \cdot (\sigma_i/\sigma_s)^2 \cdot N_0$, and continues calculation at the first and second calculating means only when the relation does not hold.

With the measuring method of the first aspect, the number of averaging N is obtained using the standard deviations $\sigma_i$ and $\sigma_s$ and the predetermined number of averaging $N_0$ to calculate the standard deviation $\sigma_s$. Thus, the number of averaging in the averaging process can be determined while maintaining compatibleness of the required measuring accuracy and efficiency in measurements.

With the measuring method of the second aspect, $1/\epsilon_1^2 \cdot (\sigma_i/\sigma_s)^2 \cdot N_0$ is obtained using the ratio of uncertainties $\epsilon_1$, and the standard deviation $\sigma_s$ is calculated employing an integer not lower than the obtained result as the number of averaging N, which enables to determine the number of averaging N in such a manner that the condition $\sigma_i<<\sigma_s$ holds.

With the measuring method of the third aspect, a value obtained by adding a predetermined allowance $N_m$ to the lowest integer not lower than the obtained result of $1/\epsilon_1^2 \cdot (\sigma_i/\sigma_s)^2 \cdot N_0$ is employed as the number of averaging N, so that an appropriate setting of the predetermined allowance $N_m$ allows to adjust the balance between the required measuring accuracy and efficiency in measurements.

With the measuring method of the fourth aspect, it is judged whether the calculated standard deviation $\sigma_s$ satisfies the relation $\sigma^i \leq \epsilon_1 \cdot \sigma_s$, which enables to determine whether a standard deviation with a sufficient measuring accuracy has been obtained. When the relation holds, later calculations can be omitted.

In the measuring device of the fifth aspect, the number of averaging N is obtained using the standard deviations $\sigma_i$ and $\sigma_s$ and the predetermined number of averaging $N_0$ to calculate the standard deviation $\sigma_s$. Thus, the number of averaging in the averaging process can be determined while maintaining compatibleness of the required measuring accuracy and efficiency in measurements.

In the measuring device of the sixth aspect, $1/\epsilon_1^2 \cdot (\sigma_i/\sigma_s)^2 \cdot N_0$ is obtained using the ratio of uncertainties $\epsilon_1$, and the standard deviation $\sigma_s$ is calculated employing an integer not lower than the obtained result as the number of averaging N, which enables to determine the number of averaging N in such a manner that the condition $\sigma_i<<\sigma_s$ holds.

In the measuring device of the seventh aspect, a value obtained by adding a predetermined allowance $N_m$ to the lowest integer not lower than the obtained result of $1/\epsilon_1^2 \cdot (\sigma_i/\sigma_s)^2 \cdot N_0$ is employed as the number of averaging N, so that an appropriate setting of the predetermined allowance $N_m$ allows to adjust the balance between the required measuring accuracy and efficiency in measurements.

In the measuring device of the eighth aspect, it is judged whether the calculated standard deviation $\sigma_s$ satisfies the relation $\sigma_i \leq \epsilon_1 \cdot \sigma_s$, which enables to determine whether a standard deviation with a sufficient measuring accuracy has been obtained. When the relation holds, later calculations can be omitted.

The present invention is directed to provide a measuring device and a measuring method for obtaining a standard deviation of a certain characteristic amount of a plurality of samples, capable of determining the number of averaging in average taking while maintaining compatibleness of required measuring accuracy and efficiency in measurements.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows a manner in which a MOS transistor MF to be a sample is actually measured;

DESCRIPTION OF THE PREFERRED EMBODIMENTS

<First Preferred Embodiment>

The present embodiment is directed to a measuring device and a measuring method for obtaining a standard deviation of a certain characteristic amount of a plurality of samples, capable of determining the number of averaging in averaging process using a standard deviation of a plurality of samples and a standard deviation obtained by making plural measurements on one of the plurality of samples, while maintaining compatibleness of required measuring accuracy and efficiency in measurements. A sample employed in the present embodiment is a semiconductor device such as a MOS (Metal Oxide Semiconductor) transistor, and characteristic amounts of a sample to be measured are electric characteristics such as voltage, current and the like.

Figure 1:
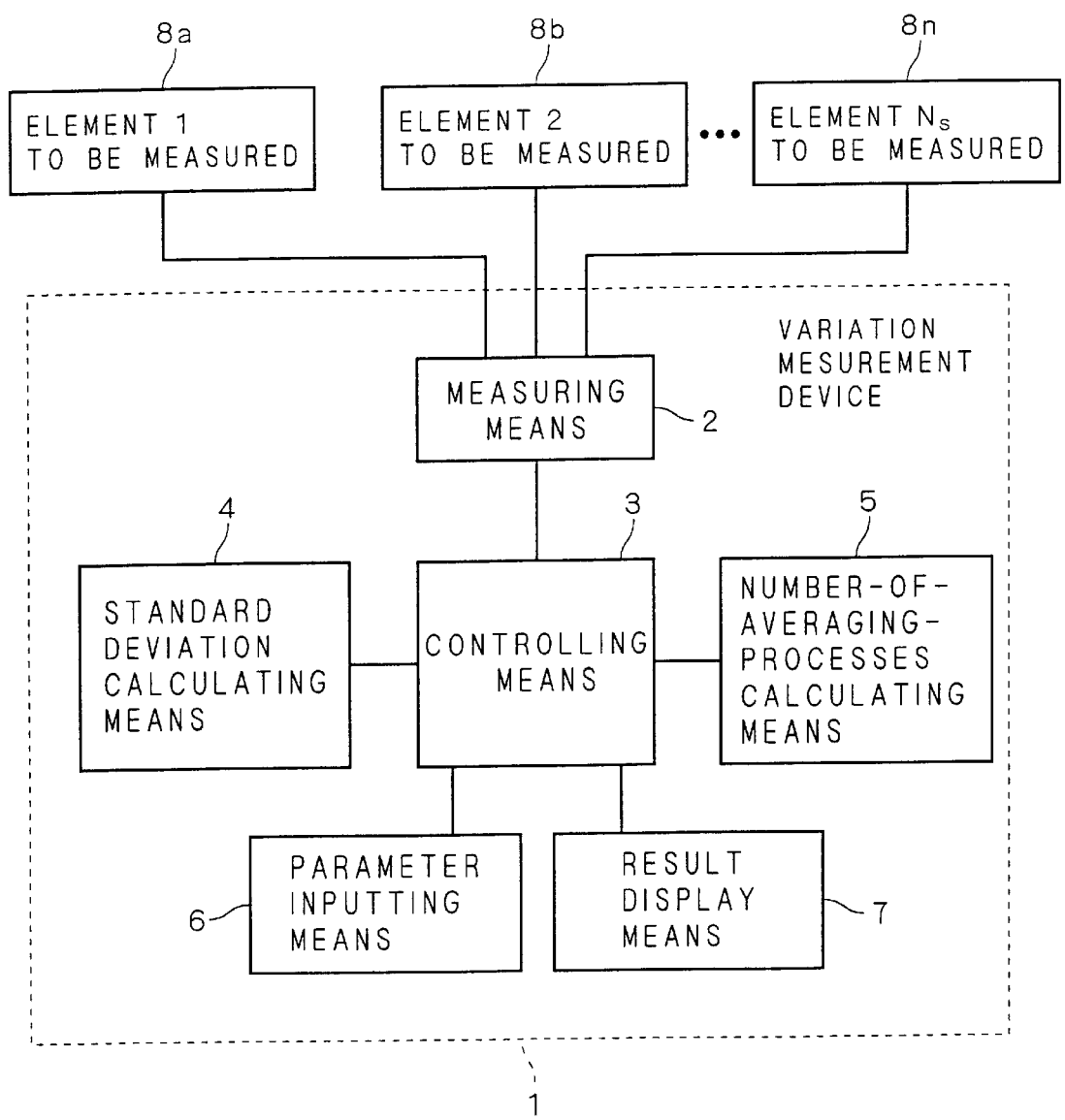
FIG. 1 shows a structure of a measuring device according to a first preferred embodiment.

FIG. 1 shows a structure of a measuring device according to the present embodiment. As shown in FIG. 1, a measuring device 1 comprises measuring means 2 including a probe and various measuring instruments for measuring electric characteristics of samples 8a to 8n, standard deviation calculating means 4 for calculating a standard deviation of a sample from a measured result obtained by the measuring means 2, number of averaging calculating means 5 for calculating what number of averaging should be performed in the averaging process, parameter inputting means 6 such as a keyboard for an operator to input a parameter setting value and the like, result display means 7 for displaying a measured result and controlling means 3 for controlling the above means and carrying out the averaging process in each measurement.

All of the standard deviation calculating means 4, the number of averaging calculating means 5 and the controlling means 3 are general CPUs (Central Processing Units) to which a ROM (Read Only Memory), a RAM (Random Access Memory) and the like are connected, which are functional components operated by a certain software program.

The standard deviation calculating means 4, the number of averaging calculating means 5 and the controlling means 3 have been stated as individual functional components, however, a CPU may be provided with the functions of the above three means to serve as one functional component.

FIG. 2 shows a manner in which a MOS transistor MF to be a sample is actually measured. In FIG. 2, a ground voltage GND is applied to a body B and a source S of the MOS transistor MF, and a DC voltage is applied between the source S and a gate G by a power source V2. Further, a power source V1 applies a DC voltage between the source S and a drain D with a resistance R1 interposed therebetween.

A voltage Vd at the drain D is amplified by an amplifier AP and is inputted in a spectrum analyzer AN. Wirings, probes and the amplifier AP each connected to sections of the MOS transistor MF form part of the measuring means 2 shown in FIG. 1, and the spectrum analyzer AN includes the other part of the measuring means 2, the controlling means 3, the standard deviation calculating means 4, the number of averaging calculating means 5, the parameter inputting means 6 and the result display means 7.

A measuring method using the above measuring device will be described hereinafter. Explanation will be given on the case of measuring a noise at the drain voltage Vd of the MOS transistor MF.

Figure 3:
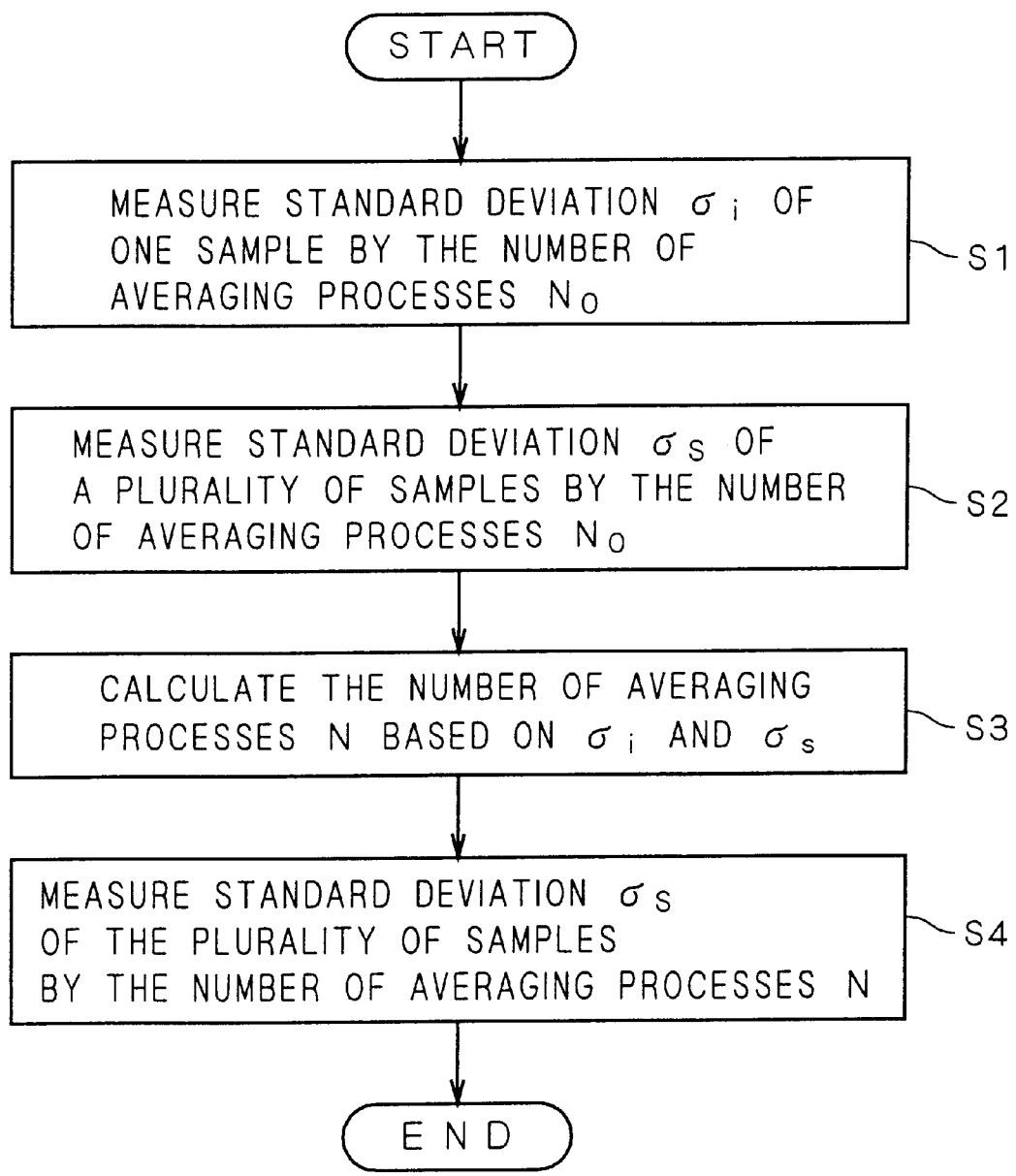
FIG. 3 is a flow chart showing a process carried out in the measuring device of the first embodiment.

FIG. 3 is a flow chart showing a process carried out in the measuring device. As shown in FIG. 3, plural measurements are made on one of a plurality of samples by the measuring means 2 under the same condition (at the same temperature and humidity in the measuring environment, with the same voltage applied to each section, and the like). Measurements are automatically carried out $N_0$ times in each of the plural measurements, $N_0$ being an initial value appropriate for the number of averaging (given in advance by an operator of the measuring device 1 through the parameter inputting means 6), and the controlling means 3 performs averaging process for obtaining an average value of measured results. The controlling means 3 provides the standard deviation calculating means 4 with the measured results from the plural measurements, so that the standard deviation calculating means 4 calculates a standard deviation $\sigma_i$ (step S1).

Since the same sample is measured under the same condition in this step, an ideal standard deviation shall be zero. However, measured values actually vary due to an influence exerted by an external noise, etc., so that the standard deviation $\sigma_i$ has a limited value.

The standard deviation $\sigma_i$ is obtained here by measuring the same sample under the same condition, and variations included therein result from an influence of uncertainties such as a noise. Thus, the standard deviation $\sigma_i$ is considered to correspond to the standard deviation $\sigma_1$ in the expression (1).

Figure 4:
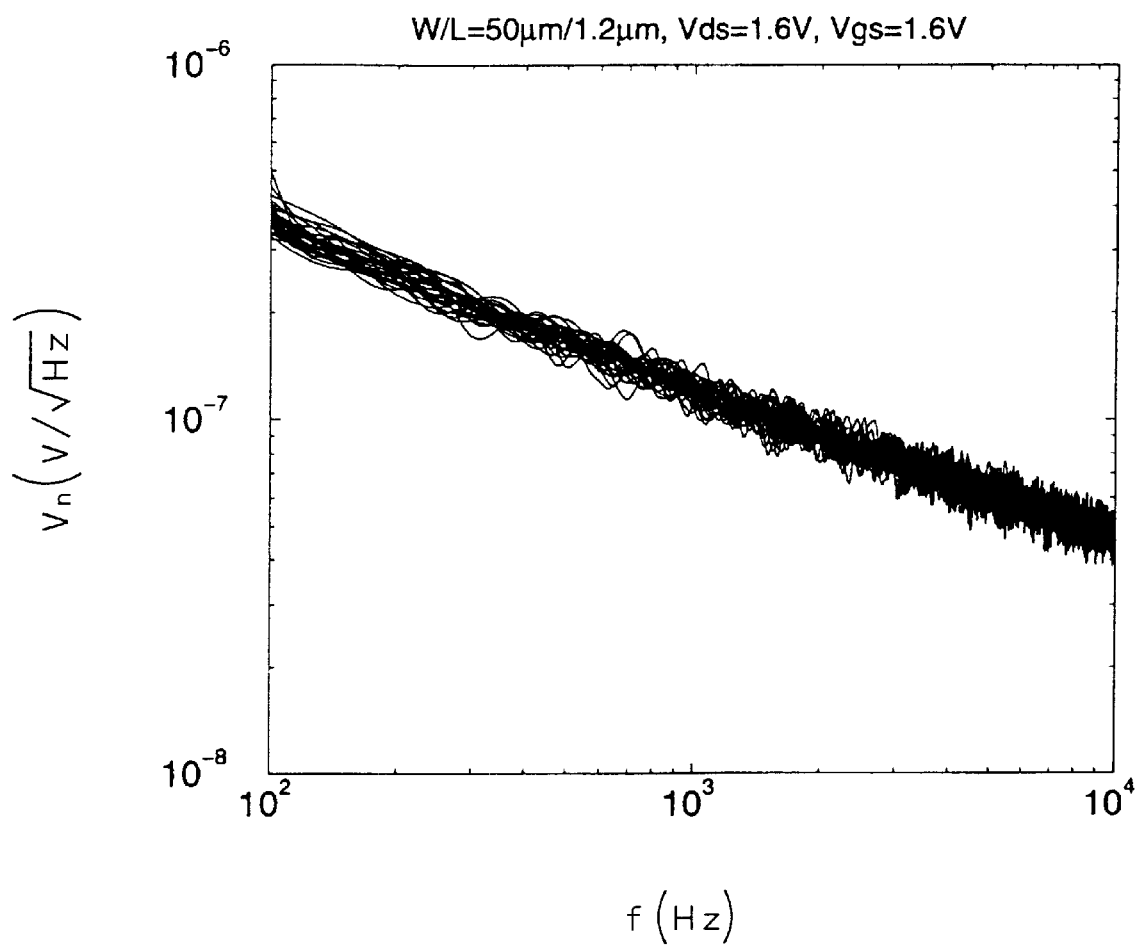
FIG. 4 shows a measured result of a noise voltage included in a source-drain voltage in the case where one of a plurality of MOS transistors is measured 30 times using the measuring device of the first embodiment setting the number of averaging $N_0=50$.

A graph shown in FIG. 4 indicates measured results of a noise voltage included in a source-drain voltage when one of a plurality of (e.g., 30 here) MOS transistors MF in a gate width of 50 $\mu$m and a gate length of 1.2 $\mu$m is measured 30 times, for example, under the condition of a source-drain voltage of 1.6V and a source-gate voltage of 1.6V, setting the number of averaging $N_0$=50. In FIG. 4, the horizontal axis indicates frequency f [Hz], and the vertical axis indicates a noise voltage Vn [V/$\sqrt{Hz}$] obtained by an energy spectrum. Although the number of MOS transistors and the number of measurements made on one MOS transistor are both indicated as 30, there is no correlation between the numbers. Therefore, the numbers may be set separately and freely.

Each curve shown in the graph of FIG. 4 indicates a measured result from each of 30 measurements. Here, the noise voltage Vn is squared to obtain a value integrated by the frequency f from 100 Hz to 10 kHz on each graph of a measured result from each measurement. Namely, 30 definite integrals of $\int (Vn)^2 df$ ranging from 100 Hz to 10 kHz are obtained.

Then, an average value is taken from 30 definite integrals obtained, and thereafter, the standard deviation $\sigma_i$ of definite integrals of a squared noise voltage $Vn^2$ is calculated using data on each of the 30 definite integrals and the average value. The standard deviation $\sigma_i$ can be obtained by dividing the total sum of squares of differences each between data on a definite integral and the average value by the number of pieces of data, i.e., 30 and taking a square root of the quotient. Calculation of the standard deviation $\sigma_i$ with the measured results shown in FIG. 4 results in $\sigma_i$=0.0310.

Next, each of the plurality of samples is measured once by the measuring means 2 under the same condition, with the number of averaging $N_0$ set in 50. More specifically, measurements by the number of averaging $N_0$=50 are automatically made on each of the plurality of samples at the measuring device 1, and the averaging process of obtaining an average value of measured results is performed by the controlling means 3. The standard deviation calculating means 4 calculates the standard deviation $\sigma_s$ based on the measured results of the plurality of samples (step S2).

Ideally, variations in characteristics of the plurality of samples alone shall be measured in this step. However, the measured values practically vary due to an influence exerted by an external noise, etc., so that the obtained standard deviation $\sigma_s$ includes variations in characteristics of the plurality of samples themselves and variations resulting from a noise, etc.

The standard deviation $\sigma_s$ obtained here includes variations in characteristics of the plurality of samples themselves and variations resulting from uncertainties such as a noise. Thus, the standard deviation $\sigma_s$ is considered to correspond to the standard deviation $\sigma$ in the expression (1).

Figure 5:
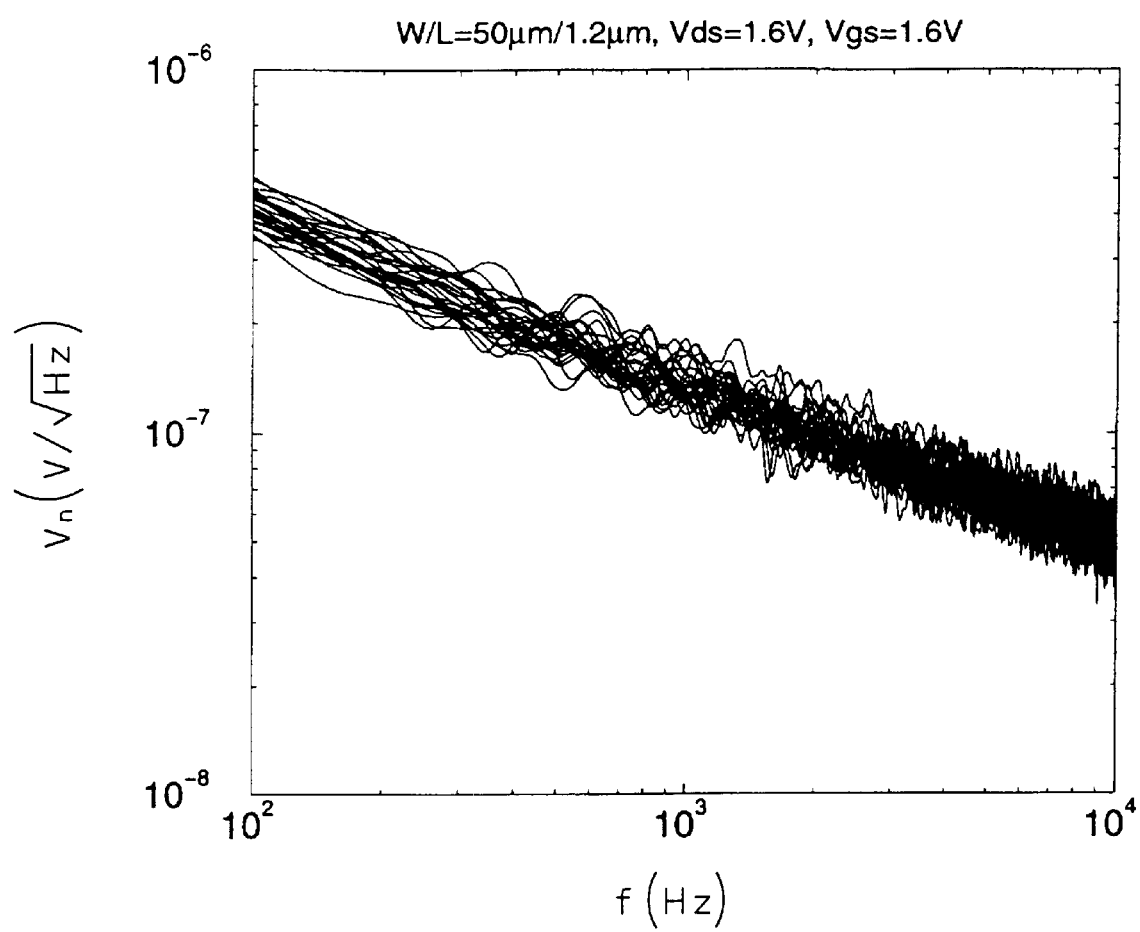
FIG. 5 shows a measured result of a noise voltage included in the source-drain voltage in the case where the plurality of, e.g., 30 MOS transistors are measured using the measuring device of the first embodiment setting the number of averaging $N_0=50$.

A graph shown in FIG. 5 indicates measured results of a noise voltage included in a source-drain voltage when each of the aforementioned plurality of (30) MOS transistors MF is measured under the condition of the source-drain voltage of 1.6V and the source-gate voltage of 1.6V, setting the number of averaging $N_0=50$. In FIG. 5, similarly to FIG. 4, the horizontal axis indicates frequency f [Hz], and the vertical axis indicates a noise voltage Vn [V/$\sqrt{Hz}$] obtained by an energy spectrum.

Each curve shown in the graph of FIG. 5 indicates a measured result of each one of 30 MOS transistors. Here, the noise voltage Vn is squared to obtain a value integrated by the frequency f from 100 Hz to 10 kHz on each graph of a measured result of each MOS transistor. Namely, 30 definite integrals of $\int (Vn)^2 df$ ranging from 100 Hz to 10 kHz are obtained.

An average value is taken from the obtained 30 definite integrals, and thereafter, the standard deviation $\sigma_s$ of definite integrals of the squared noise voltage $Vn^2$ is calculated using data on each of the 30 definite integrals and the average value. The standard deviation $\sigma_s$ can be obtained by dividing the total sum of squares of differences each between data on a definite integral and the average value by the number of pieces of data, i.e., 30 and taking a square root of the quotient. Calculation of the standard deviation $\sigma_s$ with the measured results shown in FIG. 5 results in $\sigma_s=0.179$.

Next, the number of averaging N is newly obtained at the number of averaging calculating means 5 from the standard deviations $\sigma_i$ and $\sigma_s$ obtained at steps S1 and S2 (step S3). The way to obtain the number will be described below.

When it is desired to know variations in electric characteristics among a plurality of samples, the standard deviation $\sigma_i$ resulting from uncertainties such as an external noise, etc. needs to be sufficiently smaller than the standard deviation $\sigma_0$ due to intrinsic variations among the samples. As described above, since it is considered that the standard deviation $\sigma_i$ corresponds to the standard deviation $\sigma_1$ in the expression (1) and the standard deviation $\sigma_s$ corresponds to the standard deviation $\sigma$ in the expression (1), a condition $\sigma_i << \sigma_s$ needs to be satisfied in order to obtain the standard deviation $\sigma_0$ indicative of variations in electric characteristics among the plurality of samples.

Therefore, supposing that a ratio of uncertainties in measurements, which is a requested value as a ratio between the standard deviations $\sigma_i$ and $\sigma_s$ is indicated by $\epsilon$, $\epsilon$ is defined as follows:

$$\varepsilon \equiv \frac{\sigma_i}{\sigma_s} \quad (2)$$

It can be said that, the lower the value $\epsilon$ of the ratio of uncertainties, better the standard deviation $\sigma_0$ due to intrinsic variations among the samples is reflected in a measured result.

According to the central limit theorem in the statistics, it is known that a sampling distribution obtained when n samples are taken from a population having a population mean $\rho$ and a population variance $\sigma^2$ becomes a normal distribution having an average value $\mu$ and a variance $\sigma^2/n$. Thus, when the number n of samples to be taken out is multiplied by M, then a variance of the sampling distribution becomes 1/M times. That is, a standard deviation which is a square root of the variance becomes $1/\sqrt{M}$ times.

Applying this to the present embodiment with respect to the standard deviation $\sigma_i$ resulting from uncertainties, a standard deviation obtained from measurements performed by the number of averaging N can be expressed as $\sigma_i/\sqrt{(N/N_0)}$ using the standard deviation $\sigma_i$ obtained from measurements performed by the number of averaging $N_0$. To explain this expression qualitatively, the standard deviation $\sigma_i$ resulting from uncertainties is obtained by making plural measurements on characteristics of the same sample, so that its value varies with increase or decrease in the number of averaging N.

On the other hand, with respect to the standard deviation $\sigma_s$ including variations in characteristics of samples themselves and variations resulting from uncertainties, a change of the number of averaging $N_0$ to N does not cause increase or decrease in variations in characteristics among samples. Thus, an influence exerted by increase or decrease in the number of averaging is prevented from being reflected in the standard deviation $\sigma_s$.

Taking the above into consideration, in order to restrict the ratio $\epsilon$ of uncertainties in measurements not to exceed a desired value $\epsilon_1$, $$\frac{\sigma_i/\sqrt{N/N_o}}{\sigma_s} \leq \varepsilon_1 \quad (3)$$

should be satisfied. Assuming that an allowance in measurements is $N_m$, the number of averaging N satisfying the above relation can be obtained as follows:

$$N = \left\lceil \frac{1}{\varepsilon_1^2}\left(\frac{\sigma_i}{\sigma_s}\right)^2 N_0 \right\rceil + N_m \quad (4)$$

Square brackets of the first term on the right side of the equation (4) indicate the lowest integer not lower than the number in the brackets.

Here, using the standard deviations $\sigma_i=0.0310$ and $\sigma_s=0.179$ in the case of FIGS. 4 and 5, respectively, and supposing that the ratio of uncertainties $\epsilon_1$ is 0.1 and the allowance $N_m$ is 50, the number of averaging N satisfying a desired ratio of uncertainties can be obtained as follows:

$$N = \left\lceil \frac{1}{0.1^2}\left(\frac{0.0310}{0.179}\right)^2 50 \right\rceil + 50 = 200 \quad (5)$$

The ratio of uncertainties $\epsilon_1$ and the allowance $N_m$ are inputted in the measuring device 1 through the parameter inputting means 6.

Next, each of the plurality of samples is again measured once by the measuring means 2 under the same condition by the number of averaging N. More specifically, measurements by the number of averaging $N_0=200$ are automatically made in each measurement of the plurality of samples at the measuring device 1, and averaging process of obtaining an average value of measured results is performed by the controlling means 3. The standard deviation calculating means 4 calculates a new standard deviation $\sigma_s$ based on the measured results from the plurality of samples (step S4). The standard deviation $\sigma_s$ obtained at this time satisfies a desired ratio of uncertainties $\epsilon_1$.

Figure 6:
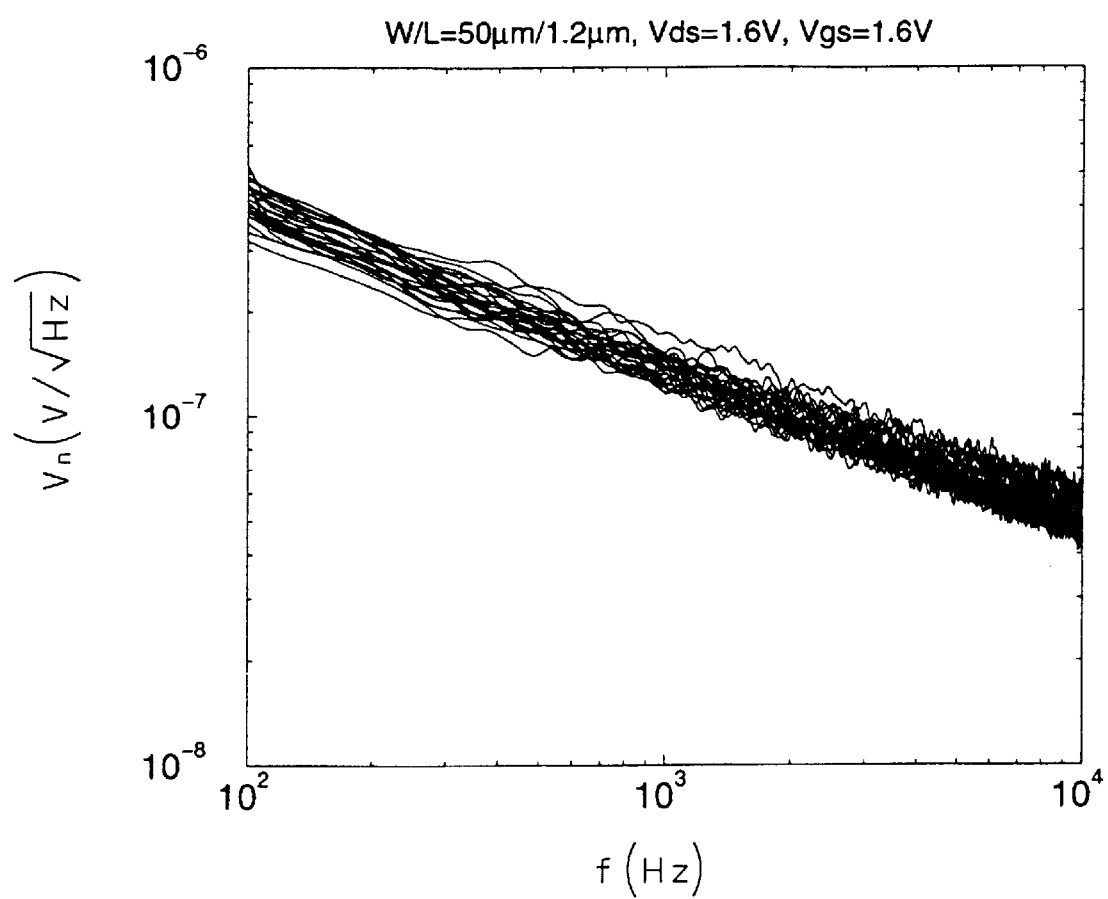
FIG. 6 shows a measured result of a noise voltage included in the source-drain voltage in the case where the plurality of, e.g., 30 MOS transistors are measured using the measuring device of the first embodiment setting the number of averaging $N_0$=200.

A graph shown in FIG. 6 indicates measured results of a noise voltage included in the source-drain voltage when each one of the aforementioned plurality of (30) MOS transistors MF is measured under the condition that the source-drain voltage is 1.6V and the source-gate voltage is 1.6V, setting the number of averaging N=200. In FIG. 6, the horizontal axis indicates frequency f [Hz], and the vertical axis indicates a noise voltage Vn [V/√Hz] obtained by an energy spectrum as in FIGS. 4 and 5.

Each curve shown in the graph of FIG. 6 indicates a measured result from each of 30 MOS transistors. Here, the noise voltage Vn is squared to obtain a value integrated by the frequency f from 100 Hz to 10 kHz on each graph of a measured result from each MOS transistor. Namely, 30 definite integrals ranging from 100 Hz to 10 kHz of $\int(Vn)^2 df$ are obtained.

Then, an average value is taken from the obtained 30 definite integrals, and thereafter, the standard deviation $\sigma_s$ of definite integrals of the squared noise voltage $Vn^2$ is calculated using data on each of the 30 definite integrals and the average value. The standard deviation $\sigma_s$ can be obtained by dividing the total sum of squares of differences each between data on a definite integral and the average value by the number of pieces of data, i.e., 30 and taking a square root of the quotient. Calculation of the standard deviation $\sigma_s$ with the measured results shown in FIG. 6 results in $\sigma_i=0.165$.

The following explains that the above value is a measured result well reflecting the standard deviation $\sigma_0$ resulting from intrinsic variations in samples.

The number of averaging $N_0=50$ and the standard deviation $\sigma_i=0.0310$ in FIG. 4. Thus, when the number of averaging N=200, then the standard deviation will be obtained as $0.0310/\sqrt{(200/50)}=0.0155$. This value is not higher than 0.1 times of the standard deviation $\sigma_s=0.165$ that is the measured result shown in FIG. 6 (ratio of uncertainties $\epsilon_1=0.1$), which satisfies a desired ratio of uncertainties.

Although the ratio of uncertainties $\epsilon_1$ has been stated as 0.1, any number may be employed, as a matter of course.

According to the measuring device of the present embodiment, the number of averaging N is obtained using the standard deviations $\sigma_i$ and $\sigma_s$ and the predetermined number of averaging $N_0$ to calculate the standard deviation $\sigma_s$. Thus, the number of averaging in the averaging process can be determined while maintaining compatibleness of the required measuring accuracy and efficiency in measurements.

Further, $1/\epsilon_1^2 \cdot (\sigma_i/\sigma_s)^2 \cdot N_0$ is obtained using the ratio of uncertainties $\epsilon_1$, and the standard deviation $\sigma_s$ is calculated employing an integer not lower than an obtained result as the number of averaging N, which enables to determine the number of averaging N in such a manner that the condition $\sigma_i \ll \sigma_s$ holds.

Furthermore, a value obtained by adding a predetermined allowance $N_m$ to the lowest integer not lower than the obtained result of $1/\epsilon_1^2 \cdot (\sigma_i/\sigma_s)^2 \cdot N_0$ is employed as the number of averaging N, so that an appropriate setting of the predetermined allowance $N_m$ allows to adjust the balance between the required measuring accuracy and efficiency in measurements.

Although the above explanation has been directed to a measuring device capable of determining the number of averaging in the averaging process while maintaining the required measuring accuracy and efficiency in measurements, a measuring method performing the same processes as the measuring device falls within the scope of the invention of the present application.

More specifically, a measuring method performing the same processes as the measuring device falls within the scope of the invention of the present application, which is a measuring method of measuring a predetermined characteristic amount of a plurality of samples to obtain a standard deviation of the characteristic amount. Each measurement performs averaging process by making measurements by a predetermined number $N_0$ to take an average value of the measured results. The method comprises the steps of: (a) making measurements on the predetermined characteristic amount of one of the plurality of samples under the same condition, thereby calculating the standard deviation $\sigma_i$ of the one sample from measured results of the measurements, (b) making a measurement on the predetermined characteristic amount of each of the plurality of samples under the same condition, thereby calculating the standard deviation $\sigma_s$ of the plurality of samples from measured results of the measurements made on the samples, (c) calculating $1/\epsilon_1^2 \cdot (\sigma_i/\sigma_s)^2 \cdot N_0$ using the ratio of uncertainties $\epsilon_1$ and employing an integer obtained by adding an allowance $N_m$ to the calculated result as the number of averaging N, and (d) performing again the averaging process by the number of averaging N while measuring the predetermined characteristic amount, and calculating the standard deviation $\sigma_s$ of the plurality of samples from measured results of the measurements made on the samples.

<Second Preferred Embodiment>

The present embodiment is related to a modification of the measuring device and the measuring method of the first embodiment. More specifically, in the present embodiment, if the ratio of uncertainties $\epsilon$ is not higher than a desired value when the standard deviation $\sigma_s$ is calculated using the initial value $N_0$ given by an operator, it is judged that a standard deviation with a sufficient measuring accuracy has been obtained, and later calculations are omitted. A structure of the measuring device of the present embodiment is the same as that of the measuring device of the first embodiment.

Figure 7:
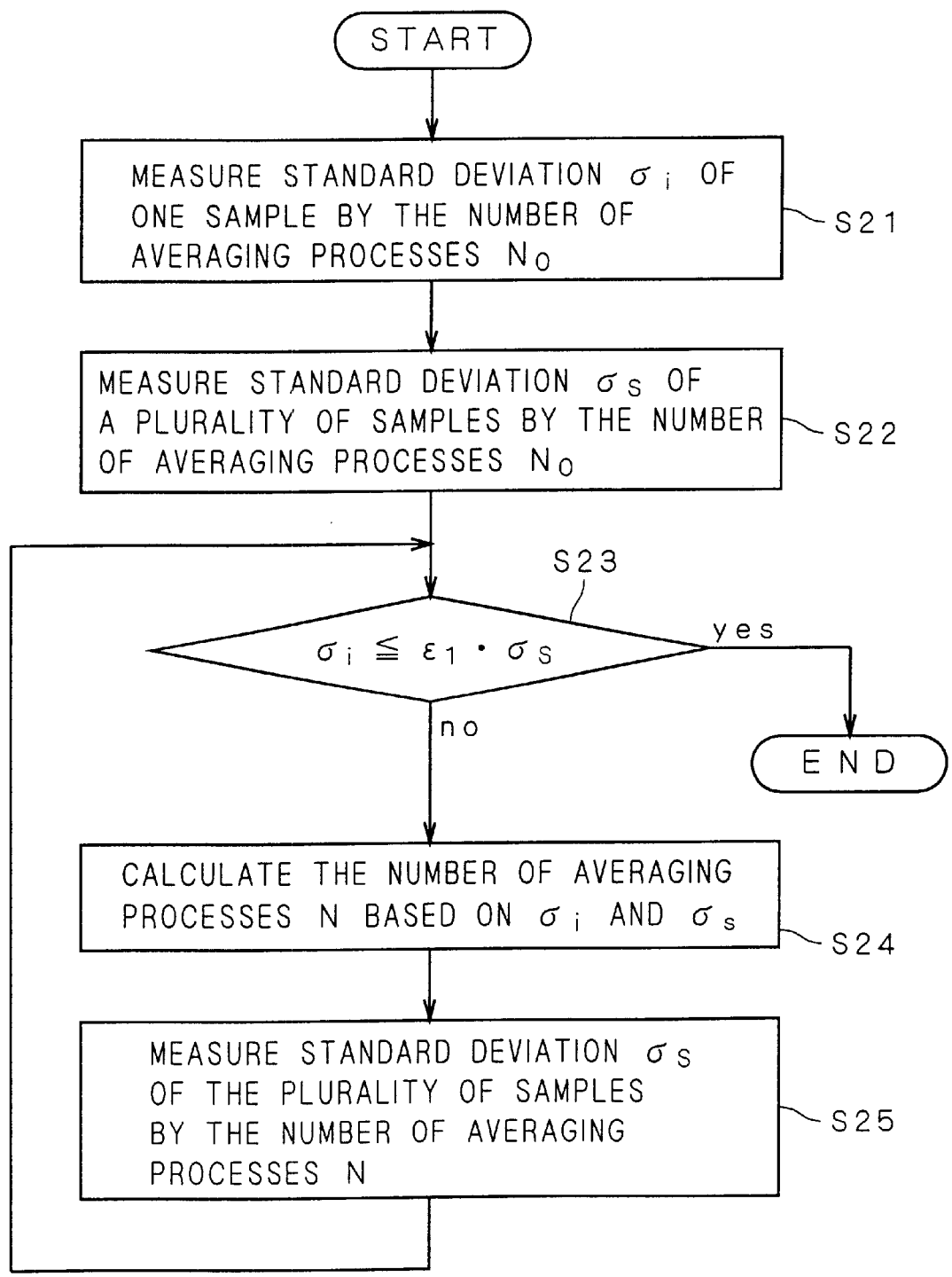
FIG. 7 is a flow chart showing a process carried out in a measuring device according to a second preferred embodiment.

FIG. 7 is a flow chart showing a process carried out in a measuring device of the present embodiment. Steps S21, S22, S24 and S25 shown in FIG. 7 are identical in contents with steps S1, S2, S3 and S4 shown in FIG. 3, respectively (although the process goes back from step S25 to step S23, which is different from step S4 in FIG. 3).

After step S22 in FIG. 7, step S23 is additionally provided in which the controlling means 3 makes a judgment using the standard deviations $\sigma_i$ and $\sigma_s$ obtained in steps S21 and S22 whether a ratio between the two deviations is not higher than a desired ratio of uncertainties $\epsilon_1$, that is, whether the relation $\sigma_i \leq \epsilon_1 \cdot \sigma_s$ holds.

The process is set to proceed into steps S24 and S25 only in the case that the above relation does not hold. In other words, if the ratio of uncertainties $\epsilon$ is not higher than a desired value when the standard deviation $\sigma_s$ is calculated using the initial value $N_0$ given by an operator, it is judged that a standard deviation with a sufficient measuring accuracy has been obtained, and later calculations are thus omitted.

The process is set to go back from step S25 to step S23. Thereby, in the case that a desired accuracy is not attained with an allowance set initially and that the allowance $N_m$ is readjusted, for example, it can be judged back into step S23 whether the adjusted value is appropriate or not.

According to the measuring device of the present embodiment, it is judged whether the calculated standard deviation $\sigma_s$ satisfies the relation $\sigma_i \leq \epsilon_1 \cdot \sigma_s$, which enables to determine whether a standard deviation with a sufficient measuring accuracy has been obtained. When the relation holds, later calculations can be omitted.

In the present embodiment as well, a measuring method performing the same processes as the above measuring device falls within the scope of the invention of the present application. More specifically, a measuring method falls within the scope of the invention, which further comprises, before the step (c), the step of (e) judging whether the standard deviation $\sigma_s$ calculated in the step (b) satisfies the relation $\sigma_i \leq \epsilon_1 \cdot \sigma_s$ using the standard deviation $\sigma_i$ and the ratio of uncertainties $\epsilon_1$ calculated in the step (a), wherein the steps (c) and (d) are performed only when the relation does not hold in the step (e).

While the invention has been shown and described in detail, the foregoing description is in all aspects illustrative and not restrictive. It is therefore understood that numerous modifications and variations can be devised without departing from the scope of the invention.

What is claimed is:

1. A measuring method of making measurements on a predetermined characteristic amount of a plurality of samples and obtaining a standard deviation of said predetermined characteristic amount of said plurality of samples, wherein averaging process of making measurements by the predetermined number $N_0$ and obtaining an average value of measured results is performed in each one of said measurements, said measuring method comprising the steps of:

(a) making plural measurements on said predetermined characteristic amount of one of said plurality of samples under the same condition, thereby calculating a standard deviation $\sigma_i$ of said one of said plurality of samples from measured results of said measurements;

(b) making a measurement on said predetermined characteristic amount of each of said plurality of samples under the same condition, thereby calculating a standard deviation $\sigma_s$ of said plurality of samples from said measured results of said measurements;

(c) obtaining the number of averaging N using said standard deviations $\sigma_i$ and $\sigma_s$ and the predetermined number $N_0$; and (d) performing again said averaging process by the number of averaging N while measuring said predetermined characteristic amount, and calculating said standard deviation $\sigma_s$ of said plurality of samples from measured results of said measurements made on said plurality of samples.

2. The measuring method according to claim 1, wherein in said step (c), $1/\epsilon_1^2 \cdot (\sigma_i/\sigma_s)^2 \cdot N_0$ is calculated using the ratio of uncertainties $\epsilon_1$ which is a requested value as a ratio between said standard deviations $\sigma_i$ and $\sigma_s$, and an integer not lower than a calculated result is employed as the number of averaging N.

3. The measuring method according to claim 2, wherein in said step (c), a value employed as the number of averaging N is obtained by adding a predetermined allowance to the lowest integer not lower than said calculated result of $1/\epsilon_1^2 \cdot (\sigma_i/\sigma_s)^2 \cdot N_0$.

4. The measuring method according to claim 2, further comprising the step of (e) judging before said step (c) whether said standard deviation $\sigma_s$ calculated in said step (b) satisfies a relation $\sigma_i \leq \epsilon_1 \cdot \sigma_s$ using said standard deviation $\sigma_i$ and said ratio of uncertainties $\epsilon_1$ calculated in said step (a), wherein said steps (c) and (d) are performed only when said relation does not hold in said step (e).

5. The measuring method according to claim 1, wherein said plurality of samples are semiconductor devices, and said predetermined characteristic amount is a predetermined electric amount of said semiconductor devices.

6. The measuring method according to claim 5, wherein said semiconductor devices are MOSFETs, and said predetermined electric amount is a noise voltage included in a source-drain voltage of said MOSFETs.

7. A measuring device comprising:

measuring means for measuring a predetermined characteristic amount of a plurality of samples;

first calculating means for calculating a standard deviation of said predetermined characteristic amount;

second calculating means for calculating the number of averaging N; and controlling means for controlling said measuring means and first and second calculating means, and causing said measuring means to make measurements by the predetermined number $N_0$ in each of said measurements, thereby performing averaging process of obtaining an average value of measured results, wherein said measuring means makes plural measurements on said predetermined characteristic amount of one of said plurality of samples under the same condition, said controlling means provides said first calculating means with measured results of said plural measurements made by said measuring means, thereby causing said first calculating means to calculate a standard deviation $\sigma_i$ of said one of said plurality of samples, said measuring means further makes a measurement on said predetermined characteristic amount of each one of said plurality of samples under the same condition, said controlling means provides said first calculating means with each of said measured results of said measurements made on said plurality of samples by said measuring means, thereby causing said first calculating means to calculate a standard deviation $\sigma_s$ of said plurality of samples, said controlling means provides said second calculating means with said standard deviations $\sigma_i$ and $\sigma_s$ obtained by said first calculating means and the predetermined number $N_0$, thereby causing said second calculating means to calculate the number of averaging N, said controlling means again performs averaging process on each of said plurality of samples by the number of averaging N, while causing said measuring means to measure said predetermined characteristic amount, and providing said first calculating means with each of said measured results of said plurality of samples made by said measuring means, thereby causing said first calculating means to calculate a standard deviation $\sigma_s$ of said plurality of samples based on said measurement results of said plurality of samples so as to be outputted.

8. The measuring device according to claim 7, wherein said second calculating means calculates $1/\epsilon_1^2 \cdot (\sigma_i/\sigma_s)^2 \cdot N_0$ using a ratio of uncertainties $\epsilon_1$ previously inputted which is a requested value as a ratio between said standard deviations $\sigma_i$ and $\sigma_s$, and employs an integer not lower than a calculated result as the number of averaging N.

9. The measuring device according to claim 8, wherein said second calculating means employs, as the number of averaging N, a value obtained by adding a predetermined allowance to the lowest integer not lower than said calculated result of $1/\epsilon_1^2 \cdot (\sigma_i/\sigma_s)^2 \cdot N_0$.

10. The measuring device according to claim 8, wherein said controlling means judges whether said standard deviation $\sigma_s$ calculated by said first calculating means satisfies a relation $\sigma_i \leq \epsilon_1 \cdot \sigma_s$ in which said standard deviation $\sigma_i$ and said ratio of uncertainties $\epsilon_1$ are used before causing said second calculating means to calculate $1/\epsilon_1^2 \cdot (\sigma_i/\sigma_s)^2 \cdot N_0$, and continues calculation at said first and second calculating means only when said relation does not hold.

11. The measuring device according to claim 7, wherein said plurality of samples are semiconductor devices, and said predetermined characteristic amount is a predetermined electric amount of said semiconductor devices.

12. The measuring device according to claim 11, wherein said semiconductor devices are MOSFETs, and said predetermined electric amount is a noise voltage included in a source-drain voltage of said MOSFETs.

* * * * *